(12) United States Patent
Mehta et al.

(10) Patent No.: US 8,901,989 B2
(45) Date of Patent: Dec. 2, 2014

(54) ADAPTIVE GATE DRIVE CIRCUIT WITH TEMPERATURE COMPENSATION

(71) Applicant: QUALCOMM Incorporated, San Diego, CA (US)

(72) Inventors: Narendra Singh Mehta, Santa Clara, CA (US); Lennart Karl-Axel Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/841,703

(22) Filed: Mar. 15, 2013

(65) Prior Publication Data

US 2014/0028357 A1  Jan. 30, 2014

Related U.S. Application Data

(60) Provisional application No. 61/676,094, filed on Jul. 26, 2012.

(51) Int. Cl.
*H03K 17/14* (2006.01)
*H03K 17/06* (2006.01)

(52) U.S. Cl.
CPC ............ *H03K 17/145* (2013.01); *H03K 17/063* (2013.01)
USPC ............ 327/378; 327/108; 327/512; 327/540

(58) Field of Classification Search
CPC ... G06F 1/567; H02M 2001/327; H02M 1/32; G05B 13/02
USPC ........................................................ 327/378
See application file for complete search history.

(56) References Cited

U.S. PATENT DOCUMENTS

| | | | | |
|---|---|---|---|---|
| 5,426,334 | A | * | 6/1995 | Skovmand ..................... 327/427 |
| 6,040,736 | A | * | 3/2000 | Milanesi et al. ............... 327/541 |
| 6,049,201 | A | * | 4/2000 | Feldtkeller .................... 323/288 |

(Continued)

FOREIGN PATENT DOCUMENTS

| | | |
|---|---|---|
| EP | 1871008 A2 | 12/2007 |
| EP | 2107673 A1 | 10/2009 |

OTHER PUBLICATIONS

Machine translation of EP 2107673 A1 obtained from http://translationportal.epo.org/emtp/translate/?ACTION=description-retrieval&COUNTRY=EP&ENGINE=google&FORMAT=docdb&KIND=A1&LOCALE=en_EP&NUMBER=2107673&OPS=ops.epo.org/3.1&SRCLANG=de&TRGLANG=en, accessed on Aug. 6, 2014.*

(Continued)

*Primary Examiner* — Thomas J Hiltunen

(57) ABSTRACT

An adaptive gate drive circuit that can generate a gate bias voltage with temperature compensation for a MOSFET is disclosed. The adaptive gate drive circuit may generate the gate bias voltage with variable drive capability to combat higher gate leakage current of the MOSFET at higher temperature. In one design, an apparatus includes a control circuit and a gate drive circuit. The control circuit generates at least one control signal having a variable frequency determined based on a sensed temperature of the MOSFET. For example, a clock divider ratio may be determined based on the sensed temperature of the MOSFET, an input clock signal may be divided based on the clock divider ratio to obtain a variable clock signal, and the control signal(s) may be generated based on the variable clock signal. The gate drive circuit generates a bias voltage for the MOSFET based on the control signal(s).

15 Claims, 5 Drawing Sheets

(56) References Cited

U.S. PATENT DOCUMENTS

| | | | |
|---|---|---|---|
| 6,320,796 B1 * | 11/2001 | Voo et al. | 365/189.09 |
| 6,366,153 B1 * | 4/2002 | Arslain et al. | 327/512 |
| 6,496,060 B2 * | 12/2002 | Takita | 330/10 |
| 6,559,689 B1 * | 5/2003 | Clark | 327/97 |
| 7,119,606 B2 * | 10/2006 | Fahim | 327/541 |
| 7,245,163 B2 * | 7/2007 | Nakamura | 327/110 |
| 7,391,273 B2 * | 6/2008 | Seki et al. | 331/47 |
| 7,521,986 B2 * | 4/2009 | Mitsuda | 327/530 |
| 7,541,781 B2 * | 6/2009 | Gamboa | 320/152 |
| 7,731,417 B2 * | 6/2010 | Kumagai | 374/1 |
| 7,821,328 B2 * | 10/2010 | Hoque et al. | 327/536 |
| 8,471,619 B2 * | 6/2013 | Ge | 327/291 |
| 8,598,854 B2 * | 12/2013 | Soenen et al. | 323/274 |
| 8,610,485 B2 * | 12/2013 | Hiyama | 327/324 |
| 2005/0094421 A1 * | 5/2005 | Flore et al. | 363/60 |
| 2008/0169863 A1 * | 7/2008 | Fukami | 327/536 |
| 2011/0050325 A1 * | 3/2011 | Schatzberger et al. | 327/536 |
| 2011/0127974 A1 * | 6/2011 | Fukushi | 323/271 |
| 2012/0126879 A1 | 5/2012 | Sandhu et al. | |
| 2012/0250385 A1 * | 10/2012 | Takihara et al. | 363/132 |
| 2012/0313718 A1 * | 12/2012 | Nakamura et al. | 331/108 R |
| 2013/0249460 A1 * | 9/2013 | Sugahara | 318/472 |

OTHER PUBLICATIONS

International Search Report and Written Opinion—PCT/US2013/052404—ISA/EPO—Oct. 22, 2013.

* cited by examiner

US 8,901,989 B2

ADAPTIVE GATE DRIVE CIRCUIT WITH TEMPERATURE COMPENSATION

CLAIM OF PRIORITY UNDER 35 U.S.C. §119

The present Application for Patent claims priority to Provisional Application No. 61/676,094, entitled "Adaptive gate charge compensation for minimizing system quiescent current and thermal runaway" filed Jul. 26, 2012, and assigned to the assignee hereof and hereby expressly incorporated by reference herein.

BACKGROUND

I. Field

The present disclosure relates generally to electronics, and more specifically to a gate drive circuit for generating a bias voltage for a transistor.

II. Background

A metal oxide semiconductor field effect transistor (MOSFET) is a type of transistor that is often used as a switch in a power circuit to provide a power supply voltage to a load. The MOSFET has a resistance between its drain and source when it is turned ON, which may be referred to as an RDS_ON resistance. The MOSFET provides a supply current to the load when it is turned ON, and this supply current dissipates via the RDS_ON resistance of the MOSFET. A gate drive circuit may generate a gate bias voltage for the MOSFET such that a sufficiently low RDS_ON resistance is obtained for the MOSFET when it is turned ON in order to limit power dissipation by the MOSFET.

SUMMARY

An adaptive gate drive circuit that can generate a gate bias voltage with temperature compensation for a MOSFET or a transistor of some other type is disclosed herein. The adaptive gate drive circuit can generate the gate bias voltage with variable drive capability in order to combat higher gate leakage current of the MOSFET at higher temperature. This may ensure that the MOSFET has sufficiently low RDS_ON resistance over temperature.

In an exemplary design, an apparatus includes a control circuit and a gate drive circuit. The control circuit generates at least one control signal having a variable frequency determined based on a sensed temperature of a MOSFET coupled between a supply voltage and a load. The gate drive circuit generates a bias voltage for the MOSFET based on the at least one control signal. The apparatus may further include a temperature sensor to sense the temperature of the MOSFET.

In an exemplary design, the control circuit includes a temperature compensation circuit, a clock divider, and a control signal generator. The temperature compensation circuit receives an input signal indicative of the sensed temperature of the MOSFET and determines a clock divider ratio based on the input signal. The clock divider divides an input clock signal based on the clock divider ratio to obtain a variable clock signal having the variable frequency. The control signal generator generates the at least one control signal based on the variable clock signal.

Various aspects and features of the disclosure are described in further detail below.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

The adaptive gate drive circuit disclosed herein may be used in (i) a power circuit that provides a supply voltage to a load and/or (ii) other circuits. The adaptive gate drive circuit may be used for various electronic devices such as wireless communication devices (e.g., cellular phones, smartphones, etc.), tablets, personal digital assistants (PDAs), handheld devices, wireless modems, laptop computers, smartbooks, netbooks, cordless phones, wireless local loop (WLL) stations, Bluetooth devices, consumer electronic devices, etc.

Figure 1:
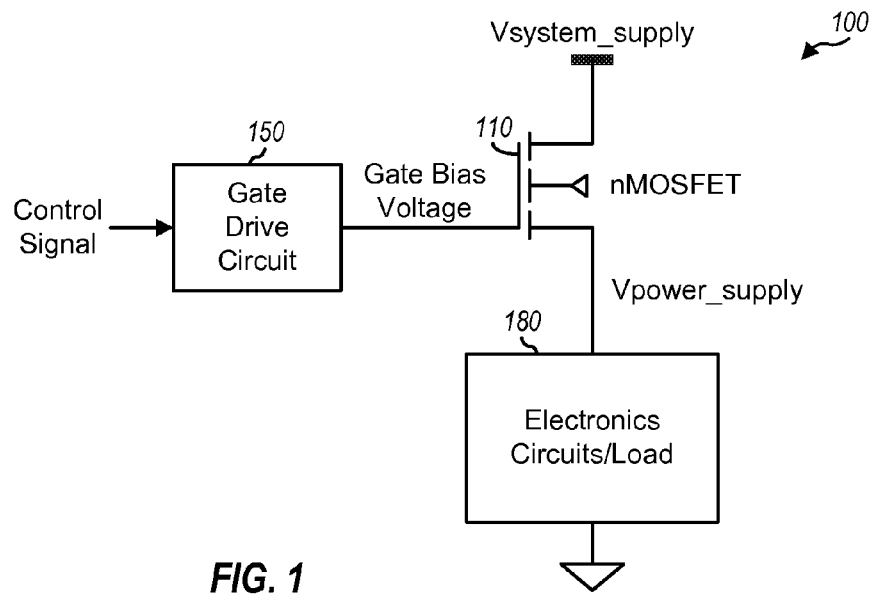
FIG. 1 shows a schematic diagram of a power circuit with a fixed gate drive.

FIG. 1 shows a schematic diagram of a power circuit 100 with a fixed gate drive. Power circuit 100 includes an N-channel MOSFET (nMOSFET) 110 and a gate drive circuit 150. nMOSFET 110 has its drain coupled to a system supply voltage (Vsystem_supply) and its source coupled to electronics circuits/load 180 and providing a power supply voltage (Vpower_supply) to load 180. Load 180 may include digital circuits and/or analog circuits operating based on the Vpower_supply voltage. Gate drive circuit 150 has an input receiving a control signal and an output coupled to the gate of nMOSFET 110.

nMOSFET 110 operates as a pass transistor that delivers the system supply voltage to load 180. Gate drive circuit 150 generates a gate bias voltage for nMOSFET 110 such that nMOSFET 110 operates in a desired operation region.

nMOSFETs such as nMOSFET 110 are commonly used in power circuits since they can provide a lower ON resistance than P-channel MOSFETs (pMOSFETs) for a given device size. However, nMOSFET 110 requires a gate bias voltage that is higher than a source voltage or a drain voltage in order to turn ON. Gate drive circuit 150 may include a charge pump that can generate a sufficiently high gate bias voltage such that nMOSFET 110 operates in the desired operation region. In particular, the gate bias voltage may be generated to be higher than the source voltage of nMOSFET 110 such that the RDS_ON resistance of nMOSFET 110 is less than a target resistance when nMOSFET 110 is turned ON. This may ensure that power dissipation by nMOSFET 110 is within a tolerable limit.

nMOSFET 110 has a gate leakage current, which is current that leaks from the gate to the source of nMOSFET 110. The gate leakage current of nMOSFET 110 may increase significantly at higher temperature.

Figure 2:
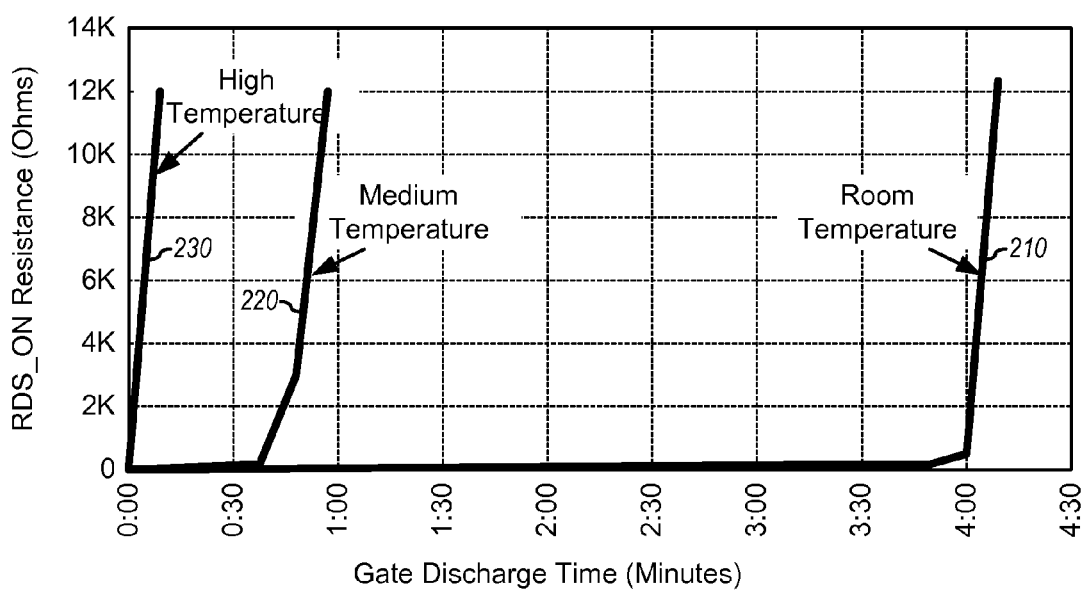
FIG. 2 shows plots of RDS_ON resistance of a MOSFET.

FIG. 2 shows plots of the RDS_ON resistance of nMOSFET 110 versus gate discharge time at different temperatures. In FIG. 2, the horizontal axis denotes time and is given in units of minutes. The vertical axis denotes RDS_ON resistance and is given in units of Ohms (Ω). A suitable gate bias voltage is applied at the gate of nMOSFET 110 by gate drive circuit 150 at time 0:00. Gate drive circuit 150 is then disconnected from the gate of nMOSFET 110, and the gate bias voltage decreases due to the gate leakage current of nMOSFET 110. The RDS_ON resistance of nMOSFET 110 increases as the gate bias voltage decreases.

A plot 210 shows the RDS_ON resistance of nMOSFET 110 versus discharge time of the gate bias voltage at a nominal/room temperature of 25° C. As shown in FIG. 2, the RDS_ON resistance stays relatively low until a time of 4:00 and then increases quickly due to a lower gate bias voltage caused by the gate leakage current. A plot 220 shows the RDS_ON resistance of nMOSFET 110 versus discharge time of the gate bias voltage at a medium temperature of 52° C. As shown in FIG. 2, the RDS_ON resistance stays relatively low until a time of 0:40 and then increases quickly due to a lower leakage-induced gate bias voltage. A plot 230 shows the RDS_ON resistance of nMOSFET 110 versus discharge time of the gate bias voltage at a high temperature of 85° C. As shown in FIG. 2, the RDS_ON resistance increases quickly as soon as gate drive circuit 150 is disconnected due to a lower leakage-induced gate bias voltage. FIG. 2 shows the gate leakage current being more problematic at progressively higher temperature.

Gate drive circuit 150 may be designed to provide sufficient drive for the gate bias voltage of nMOSFET 110 under nominal conditions, e.g., room temperature. Gate drive circuit 150 may have sufficient drive capability to account for the gate leakage current of nMOSFET 110 as well as other sources of leakage current under the nominal conditions. However, gate drive circuit 150 may be unable to provide sufficient drive to account for significantly higher gate leakage current of nMOSFET 110 at higher temperature. This may result in the gate bias voltage being lower than necessary to obtain the target RDS_ON resistance for nMOSFET 110 at higher temperature. The higher RDS_ON resistance at higher temperature may increase power dissipation by nMOSFET 110, which may further increase temperature and exacerbate gate leakage. The higher RDS_ON resistance of nMOSFET 110 at higher temperature may thus cause thermal runaway and other problems.

Gate drive circuit 150 may be designed to provide sufficient drive capability for the gate bias voltage of nMOSFET 110 under worst-case conditions, e.g., the highest temperature specified for power circuit 100. However, the higher drive capability for the gate bias voltage may be obtained at the expense of higher power consumption by gate drive circuit 150. This may result in gate drive circuit 150 consuming more battery power even under nominal conditions.

In an aspect of the present disclosure, an adaptive gate drive circuit can generate a gate bias voltage for an nMOSFET with variable drive capability in order to combat higher gate leakage current of the nMOSFET at higher temperature. This may be achieved by detecting the temperature of the nMOSFET and providing greater drive capability to account for higher gate leakage current of the nMOSFET at higher temperature.

The gate drive circuit may include a charge pump that receives one or more control signals and provides the gate bias voltage for the nMOSFET. The charge pump may have a drive capability that is dependent on (e.g., proportional to) the frequency of the control signal(s) provided to the charge pump. In an exemplary design, the charge pump may be operated at a variable frequency that may be dependent on the detected temperature of the nMOSFET. In particular, the charge pump may be operated at (i) a higher frequency at higher temperature in order to provide greater drive capability for the gate bias voltage or (ii) a lower frequency at lower temperature in order to reduce power consumption of the gate drive circuit when the gate leakage current is lower.

Figure 3:
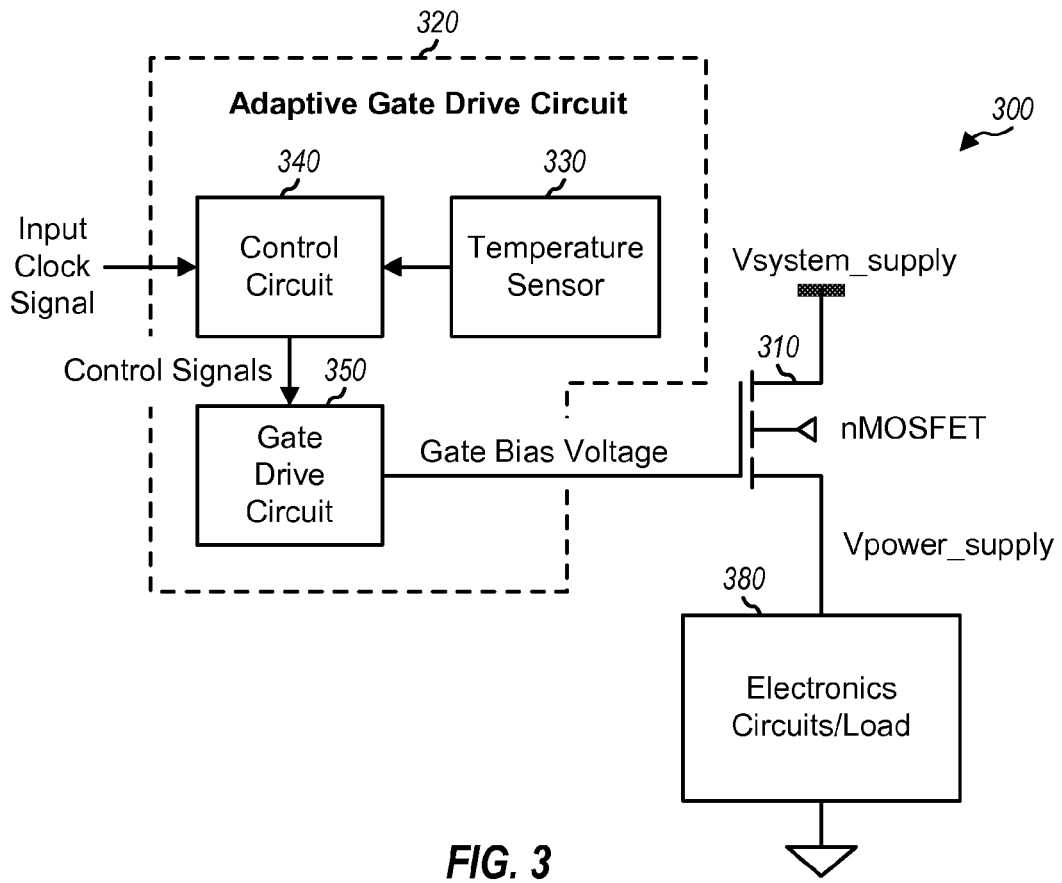
FIG. 3 shows a schematic diagram of a power circuit with an adaptive gate drive.

FIG. 3 shows a schematic diagram of an exemplary design of a power circuit 300 with an adaptive gate drive. Power circuit 300 includes an nMOSFET 310 and an adaptive gate drive circuit 320. nMOSFET 310 has its drain coupled to a system supply voltage (Vsystem_supply) and its source coupled to electronics circuits/load 380 and providing a power supply voltage (Vpower_supply) to load 380. Load 380 may include digital circuits and/or analog circuits operating based on the Vpower_supply voltage. Gate drive circuit 350 has an input receiving an input clock signal and an output coupled to the gate of nMOSFET 310.

In the exemplary design shown in FIG. 3, adaptive gate drive circuit 320 includes a temperature sensor 330, a control circuit 340, and a gate drive circuit 350. Temperature sensor 330 senses the temperature of nMOSFET 310 (or the temperature near nMOSFET 310) and provides a sensed temperature signal to control circuit 340. The sensed temperature signal is indicative of the temperature sensed by temperature sensor 330. Control circuit 340 receives the input clock signal and the sensed temperature signal and generates control signals for gate drive circuit 350. Gate drive circuit 350 generates a gate bias voltage with variable drive capability determined based on the control signals and provides the gate bias voltage to the gate of nMOSFET 310. Gate drive circuit 350 may be able to provide a higher gate bias voltage and/or more bias current to the gate of nMOSFET 310 in order to account for higher gate leakage current at higher temperature.

FIG. 3 shows an exemplary design in which adaptive gate drive circuit 320 includes temperature sensor 330, control circuit 340, and gate drive circuit 350. An adaptive gate drive circuit may also be implemented in other manners. For example, an adaptive gate drive circuit may include a temperature sensor coupled directly to a gate drive circuit. An adaptive gate drive circuit may also include other circuits not shown in FIG. 3.

FIG. 3 also shows an exemplary design in which the control signals for gate drive circuit 350 are generated based on the input clock signal and the sensed temperature signal. The control signals for gate drive circuit 350 may also be generated with other signals and/or in other manners.

Temperature sensor 330, control circuit 340, and gate drive circuit 350 within adaptive gate drive circuit 320 may be implemented in various manners. Some exemplary designs of temperature sensor 330, control circuit 340, and gate drive circuit 350 are described below.

Figure 4:
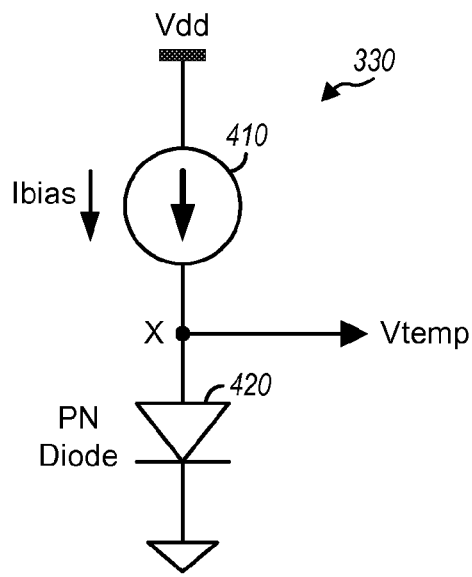
FIG. 4 shows a schematic diagram of a temperature sensor.

FIG. 4 shows a schematic diagram of an exemplary design of temperature sensor 330 within adaptive gate drive circuit 320 in FIG. 3. In this design, temperature sensor 330 includes a current source 410 and a PN diode 420. Current source 410 has one end coupled to a power supply voltage (Vdd) and the other end coupled to node X. PN diode 420 has an anode coupled to node X and a cathode coupled to circuit ground.

Node X is an output of temperature sensor 330 and provides a sensed temperature signal, which may be a voltage signal (Vtemp).

Current source 410 may provide a fixed bias current of Ibias, which may be independent of temperature or may vary as little as possible over temperature. PN diode 420 conducts the bias current from current source 410 and has a voltage drop that is dependent on various factors such as the amount of current conducted by PN diode 420, the size of PN diode 420, and temperature. For a given amount of bias current and a given PN diode size, the voltage drop across PN diode 420 (and hence the Vtemp voltage) is inversely related to temperature. For example, Vtemp for three different temperatures may be as follows:

Vtemp=Vhigh_temp at 100° C. (e.g., Vhigh_temp=0.6 V),
Vtemp=Vnom_temp at 25° C. (e.g., Vnom_temp=0.75 V), and
Vtemp=Vlow_temp at −40° C. (e.g., Vlow_temp=0.88 V).

Vtemp may also have other voltages at different temperatures, which may be dependent on the factors listed above.

FIG. 4 shows an exemplary design of temperature sensor 330 based on a PN diode. Temperature sensor 330 may also be implemented in other manners known by one skilled in the art.

Figure 5:
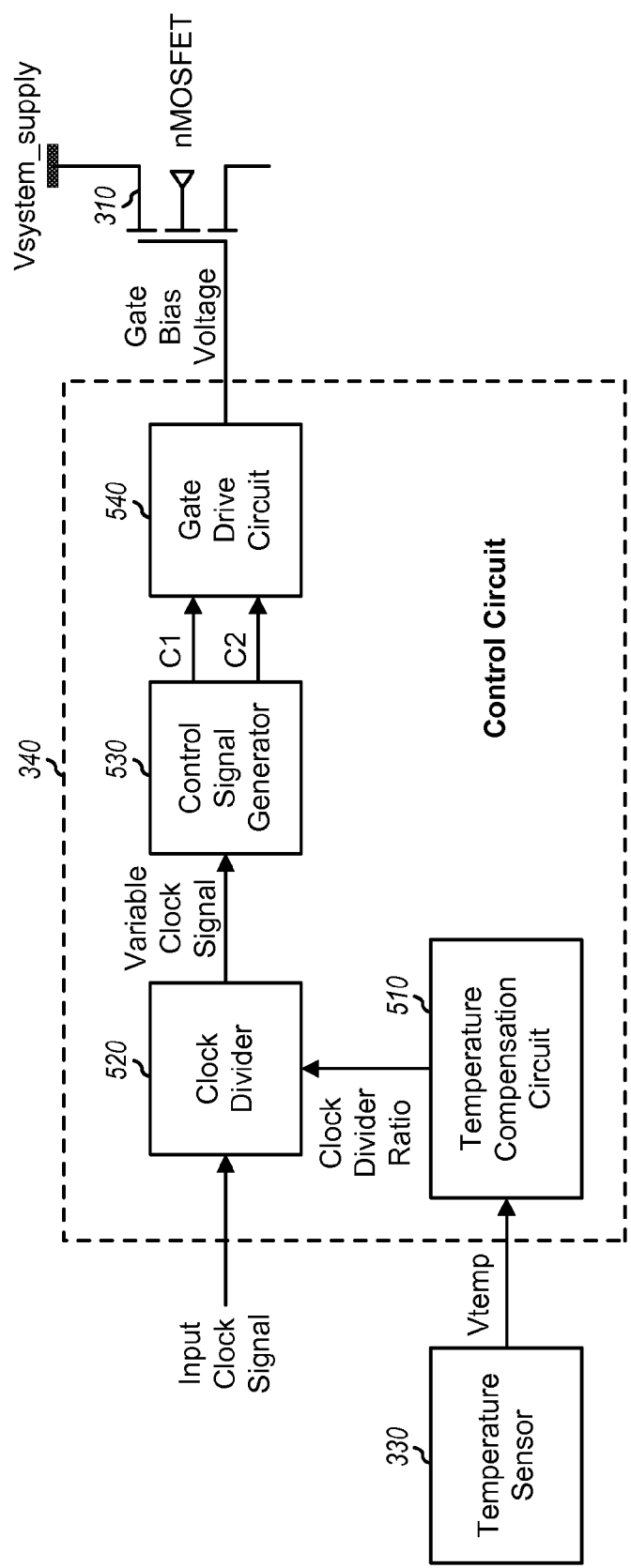
FIG. 5 shows a block diagram of a control circuit.

FIG. 5 shows a block diagram of an exemplary design of control circuit 340 within adaptive gate drive circuit 320 in FIG. 3. In this design, control circuit 340 includes a temperature compensation circuit 510, a clock divider 520, a control signal generator 530, and a gate drive circuit 540. Temperature compensation circuit 510 receives the sensed temperature signal (or the Vtemp signal) from temperature sensor 330 and generates a clock divider ratio for clock divider 520. Clock divider 520 divides the input clock signal in frequency based on the clock divider ratio and provides a variable clock signal to control signal generator 530. Generator 530 generates control signals for gate drive circuit 350 based on the variable clock signal. The frequency of the control signals is determined by (e.g., is equal to) the frequency of the variable clock signal. Gate drive circuit 350 receives the control signals and generates a gate bias voltage for nMOSFET 310.

Gate drive circuit 350 may include a charge pump having a drive capability determined based on the frequency of the control signals. The charge pump may have higher drive capability for faster control signals and lower drive capability for slower control signals. Higher drive capability may be required to account for higher gate leakage current at higher temperature, and lower drive capability may be sufficient for lower gate leakage current at lower temperature.

Temperature compensation circuit 510 may generate the clock divider ratio based on the sensed temperature signal and may provide (i) a smaller clock divider ratio for a higher sensed temperature or (ii) a larger clock divider ratio for a lower sensed temperature. Clock divider 520 may divide the input clock signal by the clock divider ratio and provide the variable clock signal, which may have (i) a faster rate/higher frequency for a smaller clock divider ratio when a higher temperature is sensed or (ii) a slower rate/lower frequency for a larger clock divider ratio when a lower temperature is sensed. Control signal generator 530 may generate the control signals based on the variable clock signal and may provide (i) slower control signals with a slower clock signal for a lower sensed temperature or (ii) faster control signals with a faster clock signal for a higher sensed temperature. The charge pump within gate drive circuit 350 may generate the gate bias voltage with (i) higher drive capability based on faster control signals for a higher sensed temperature or (ii) lower drive capability based on slower control signals for a lower sensed temperature.

Temperature compensation circuit 510, clock divider 520, control signal generator 530, and gate drive circuit 540 may be implemented in various manners. Some exemplary designs of temperature compensation circuit 510, clock divider 520, control signal generator 530, and gate drive circuit 540 are described below.

Figure 6A:
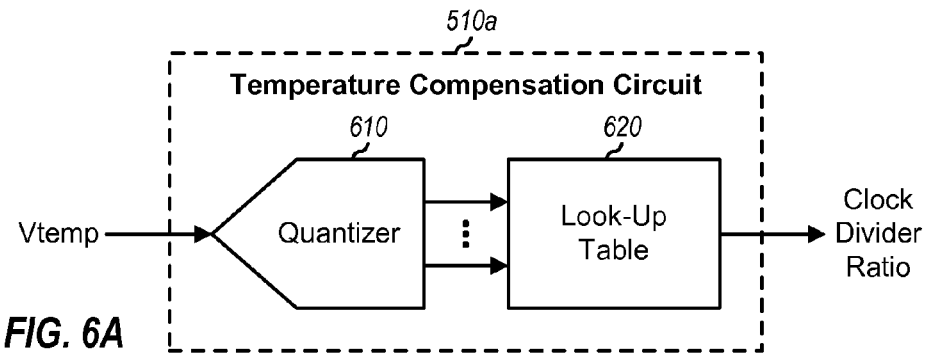
FIGS. 6A and 6B show two exemplary designs of a temperature compensation circuit.

FIG. 6A shows a block diagram of a temperature compensation circuit 510a, which is one exemplary design of temperature compensation circuit 510 within control circuit 340 in FIG. 3. In this design, temperature compensation circuit 510a includes a quantizer 610 and a look-up table 620. Quantizer 610 receives the sensed temperature signal (the Vtemp signal) from temperature sensor 330, quantizes this signal to obtain digital values, and provides the digital values to look-up table 620. Look-up table 620 receives the digital values from quantizer 610 and provides clock divider ratios. Each digital value may correspond to a quantized value of the sensed temperature signal at a specific time instant, and the quantized value may be indicative of the sensed temperature at that time instant. Look-up table 620 may map each digital value to a suitable clock divider ratio such that a desired/target frequency of the control signals is obtained for a sensed temperature corresponding to that digital value.

In general, quantizer 610 may quantize the sensed temperature signal to digital values having any number of bits of resolution. Digital values of more bits may allow for adjustment of the drive capability of gate drive circuit 350 with finer granularity at the expense of a larger look-up table 620.

Figure 6B:
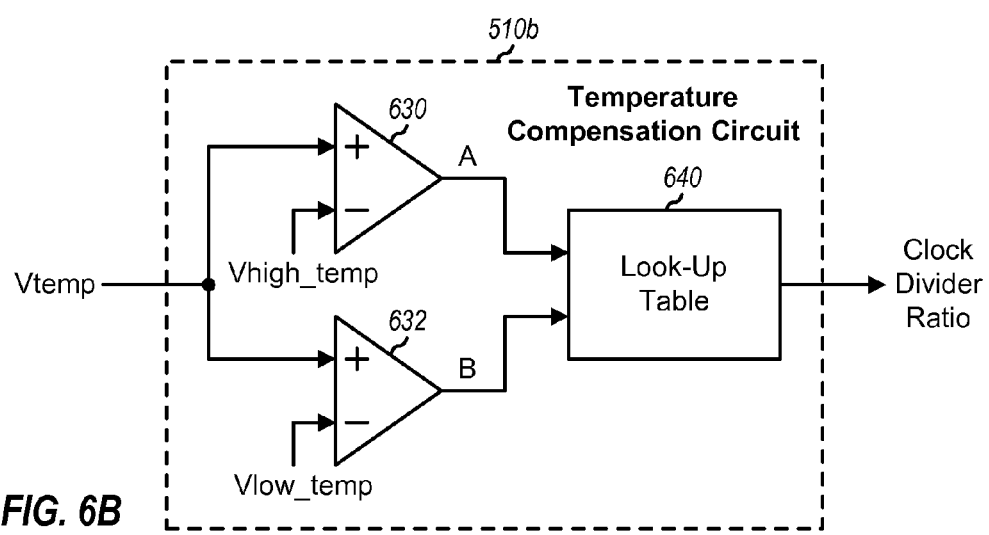

FIG. 6B shows a schematic diagram of a temperature compensation circuit 510b, which is another exemplary design of temperature compensation circuit 510 within control circuit 340 in FIG. 3. In this design, temperature compensation circuit 510b includes two comparators 630 and 632 and a look-up table 640. Comparator 630 receives the Vtemp signal at a non-inverting input and a Vhigh_temp voltage at an inverting input and provides a first quantized signal (A). Comparator 632 receives the Vtemp signal at a non-inverting input and a Vnom_temp voltage at an inverting input and provides a second quantized signal (B).

In one example, the Vhigh_temp voltage may be equal to 0.6V, which may correspond to the Vtemp voltage at 100° C. The Vnom_temp voltage may be equal to 0.75V, which may correspond to the Vtemp voltage at 25° C. Comparator 630 may output (i) a logic high ('1') on the A signal when the Vtemp signal exceeds 0.6V, which may be the case when the sensed temperature is lower than 100° C., or (ii) a logic low ('0') otherwise. Comparator 632 may output (i) a logic high ('1') on the B signal when the Vtemp signal exceeds 0.75V, which may be the case when the sensed temperature is lower than 25° C., or (ii) a logic low ('0') otherwise. Table 1 lists three possible states of the A and B signals from comparators 630 and 632, a temperature range for each state, a clock divider ratio for each state, and a description for each state for the exemplary design shown in FIG. 6B. This design, comparators 630 and 632 are used to sense temperature within three ranges, which include a first temperature range of greater than 100° C., a second temperature range between 25° C. and 100° C., and a third temperature range of less than 25° C. The sensed temperature falls within one of the three temperature ranges. The temperature range covering the sensed temperature is reflected by the logic values of the A and B signals, as shown in Table 1. Each temperature range is associated with a specific clock divider ratio. As shown in Table 1, progressively higher temperature ranges are associated with progressively lower clock divider ratios, which corresponds to progressively higher clock speeds for the control signals provided to gate drive circuit 350 and progressively greater gate drive capability by gate drive circuit 350.

TABLE 1

| A Signal | B Signal | Sensed Temperature | Clock Divider Ratio | Description |
| --- | --- | --- | --- | --- |
| 0 | 0 | Temp > 100° C. | 1 | Hot temperature sensed. Large gate leakage current. Highest clock speed to obtain greatest gate drive capability. |
| 1 | 0 | 25° C. < Temp < 100° C. | 128 | Medium temperature sensed. Some gate leakage current. Moderate clock speed to obtain moderate gate drive capability and some power savings. |
| 1 | 1 | Temp < 25° C. | 1024 | Low temperature sensed. Small gate leakage current. Slow clock speed to obtain full power savings. |

FIG. 6B and Table 1 show an exemplary design in which the Vtemp signal is quantized to 2-bit digital values used to detect temperature within three ranges. The Vtemp signal may also be quantized to digital values of more or fewer bits to detect temperature within more or fewer ranges. For example, the Vtemp signal may be provided to a single comparator and quantized to 1-bit digital values used to detect temperature within two ranges.

FIGS. 6A and 6B show exemplary designs in which a look-up table receives quantized values for the Vtemp signal and provides clock divider ratios. In another design, the Vtemp signal may be used to control the frequency of a voltage-controlled oscillator (VCO) or a current-controlled oscillator (ICO). For example, the Vtemp signal may adjust a variable capacitor (varactor) of a VCO, which may then vary the frequency of the VCO. In another example, a current source may provide an output current that is proportional to absolute temperature (PTAT), and this output current may charge a capacitor of an RC oscillator comprising the capacitor and a resistor.

Referring back to FIG. 5, clock divider 520 receives and divides the input clock signal based on a clock divider ratio from temperature compensation circuit 510 and provides the variable clock signal. The clock divider ratio may change over time due to temperature variation and/or other factors. Control signal generator 530 receives the variable clock signal and generates C1 and C2 control signals for gate drive circuit 350.

Figure 7:
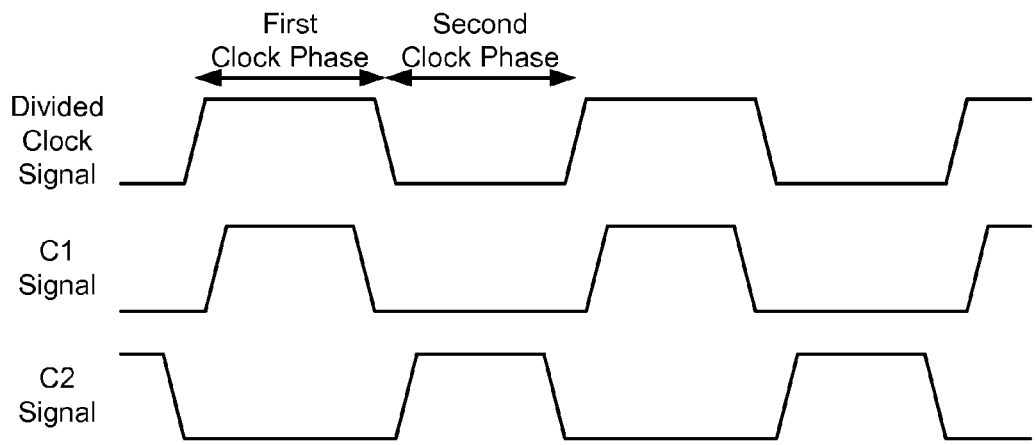
FIG. 7 shows a timing diagram of a variable clock signal and control signals.

FIG. 7 shows a timing diagram of the variable clock signal and the C1 and C2 control signals. The variable clock signal has a frequency determined by a clock divider ratio and an approximately 50% duty cycle. The C1 and C2 control signals have the same frequency as that of the variable clock signal and are non-overlapping, so that only one control signal (if any) is active at any given moment. For example, the C1 signal may be active for less than the duration of each logic high pulse of the variable clock signal during a first clock phase, as shown in FIG. 7. The C2 signal may be active for less than the duration of each logic low pulse of the variable clock signal during a second clock phase, as also shown in FIG. 7. The C1 and C2 control signals may also be generated in other manners.

Figure 8:
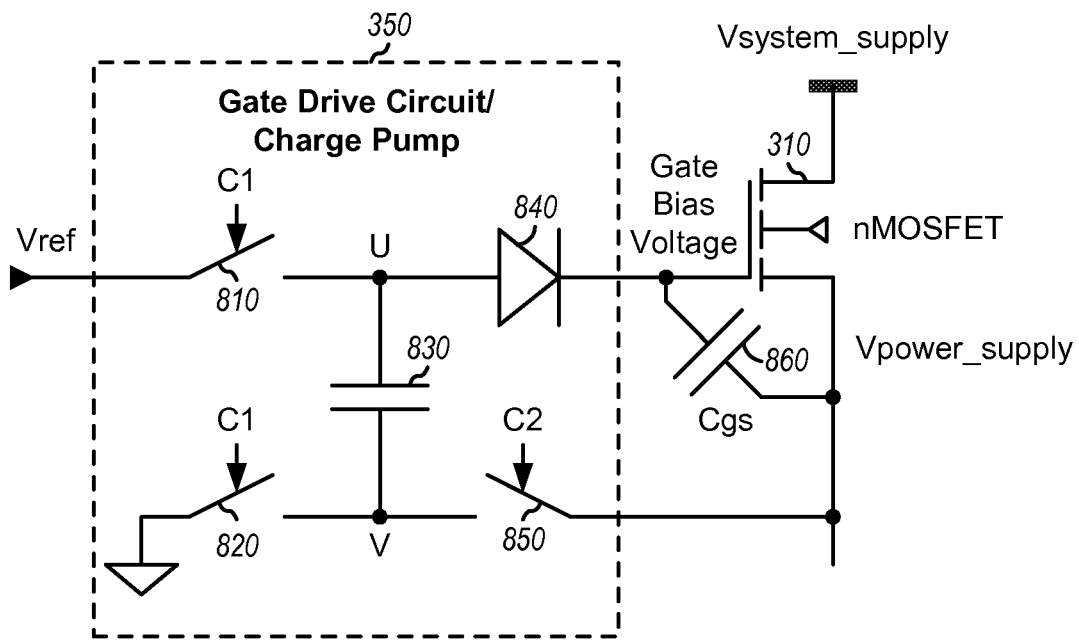
FIG. 8 shows a schematic diagram of a gate drive circuit.

FIG. 8 shows a schematic diagram of an exemplary design of gate drive circuit 350 within adaptive gate drive circuit 320 in FIG. 3. In this design, gate drive circuit 350 implements a charge pump that receives a reference voltage (Vref) and generates a gate bias voltage for nMOSFET 310. The Vref voltage may be a battery voltage, the system supply voltage, or some other voltage.

Within gate drive circuit 350, a switch 810 has one terminal receiving the Vref voltage and the other terminal coupled to node U. A switch 820 has one terminal coupled to circuit ground and the other terminal coupled to node V. A capacitor 830 is coupled between node U and node V. A diode 840 has its anode coupled to node U and its cathode coupled to the gate of nMOSFET 310. A switch 850 has one terminal coupled to node V and the other terminal coupled to the source of nMOSFET 310. Switches 810 and 820 are controlled by the C1 control signal. Switch 850 is controlled by the C2 control signal. Diode 840 may be replaced with a switch coupled between node U and the gate of nMOSFET 310 and controlled by the C2 control signal.

Gate drive circuit 350 operates as follows. During the first clock phase corresponding to logic high on the variable clock signal, switches 810 and 820 are closed, and switch 850 is opened. Capacitor 830 is charged by the Vref voltage, and a voltage drop of Vref develops across capacitor 830. During the second clock phase corresponding to logic low on the variable clock signal, switches 810 and 820 are opened, and switch 850 is closed. Capacitor 830 is coupled between the gate and source of nMOSFET 310, and the voltage drop of Vref across capacitor 830 is applied between the gate and source of nMOSFET 310. The voltage at the gate of nMOSFET 310 is approximately Vref (minus the voltage drop across diode 840) higher than the voltage at the source of nMOSFET 310. Gate drive circuit 350 thus translate the Vref voltage, reference to circuit ground, at its input to an approximately Vref voltage difference between the gate and source of nMOSFET 310.

As shown in FIG. 8, nMOSFET 310 has a parasitic gate-to-source capacitor (Cgs) 860, which may be relatively large due to a large diversity size of nMOSFET 310 in order to provide a sufficiently low RDS_ON resistance when nMOSFET 310 is turned ON. Capacitor 830 may be much smaller than Cgs capacitor 860 in order to reduce circuit area of capacitor 830. For example, Cgs capacitor 860 may be a hundred to a thousand times larger than capacitor 830. Capacitor 830 may be charge by the Vref voltage during the first clock phase and may provide its charge to Cgs capacitor 860 during the second clock phase. Cgs capacitor 860 may be charges to Vref by capacitor 830 after successive charge transfers in many clock cycles.

A gate leakage current flows through Cgs capacitor 860 and reduces the charge on Cgs capacitor 860, which then reduces the gate bias voltage of nMOSFET 310. Capacitor 830 may be charged by the Vref voltage and may discharge to Cgs capacitor 860 at a frequency of f corresponding to a clock period of T. At low temperature (e.g., less than 25° C.), the gate leakage current may be relatively low, and capacitor 830 may be able to supply the low gate leakage current in each clock cycle of T. Hence, the gate bias voltage may be maintained, and the RDS_ON resistance may be relatively low. At high temperature (e.g., greater than 100° C.), the gate leakage current may be relatively high, and capacitor 830 may be unable to supply the high gate leakage current in each clock cycle of T. Hence, the gate bias voltage may drop by a relatively large amount after some number of clock cycles, and the RDS_ON resistance may increase by a large amount.

Greater drive capability may be obtained by charging capacitor 830 at a faster rate corresponding to a shorter clock period. For example, capacitor 830 may be charged at a frequency of 2f corresponding to a clock period of T/2. Capacitor 830 may then be charged twice as quickly and may provide approximately twice the charge to Cgs capacitor 860. In general, capacitor 830 may be able to provide more charge and more drive capability and may be able to combat larger gate leakage current when it is charged and discharged at a faster rate. The rate of charging and discharging capacitor 830 may be dependent on the amount of gate leakage current, which may be dependent on temperature. The rate of charging and discharging capacitor 830 may thus be selected as a function of temperature. In general, the rate of charging and discharging capacitor 830 as well as the size of capacitor 830 may be selected to provide sufficient gate drive to maintain nMOSFET 310 in a desired operation region across a target range of temperatures.

FIG. 8 shows a schematic diagram of an exemplary design of gate drive circuit 350 that receives Vref and provides Vgs of approximately Vref for nMOSFET 310. In another design, a gate drive circuit receives Vref and provides Vgs of greater than Vref for an nMOSFET. In this design, the gate drive circuit may include (i) a voltage multiplier (e.g., a voltage doubler) to generate a multiplied voltage that is higher than Vref and (ii) a charge pump to generate Vgs for the nMOSFET based on the multiplied voltage.

FIG. 8 also shows a schematic diagram of an exemplary design of gate drive circuit 350 implemented with a charge pump that receives charge from Vref and provides the charge to Cgs capacitor 860. A gate drive circuit may also be implemented with circuits of other types having variable drive capability.

In an exemplary design, an apparatus (e.g., a wireless device, an IC, a circuit module, etc.) may include a control circuit and a gate drive circuit. The control circuit (e.g., control circuit 340 in FIG. 3) may generate at least one control signal having a variable frequency determined based on a sensed temperature of a MOSFET (e.g., nMOSFET 310 in FIG. 3). The nMOSFET may be coupled between a supply voltage (e.g., a system supply voltage) and a load (e.g., load 380). The gate drive circuit (e.g., gate drive circuit 350) may generate a bias voltage for the MOSFET based on the at least one control signal. The apparatus may further include a temperature sensor (e.g., temperature sensor 330) that senses the temperature of the MOSFET.

In an exemplary design, the control circuit may include a control signal generator (e.g., control signal generator 530 in FIG. 5) that receives a variable clock signal having the variable frequency and generates the at least one control signal based on the variable clock signal. The control circuit may further include a temperature compensation circuit and a clock divider. The temperature compensation circuit (e.g., temperature compensation circuit 510) may receive an input signal indicative of the sensed temperature of the MOSFET and may determine a clock divider ratio based on the input signal. The clock divider (e.g., clock divider 520) may divide an input clock signal based on the clock divider ratio to obtain the variable clock signal.

In an exemplary design, the temperature compensation circuit may include a quantizer and a look-up table. The quantizer (e.g., quantizer 610 in FIG. 6A) may quantize the input signal and provide a digital value. The look-up table (e.g., look-up table 620) may receive the digital value and provide the clock divider ratio. In another exemplary design, the temperature compensation circuit may include at least one comparator and a look-up table. The at least one comparator (e.g., comparators 630 and 632 in FIG. 6B) may compare the input signal against at least one threshold and provide at least one output signal. The look-up table (e.g., look-up table 640) may receive the at least one output signal and provide the clock divider ratio. In yet another exemplary design, the control circuit may include an oscillator that receives the input signal indicative of the sensed temperature of the MOSFET and provides the variable clock signal. The temperature compensation circuit may also be implemented in other manners.

In an exemplary design, the gate drive circuit may be implemented as (or may include) a charge pump that receives the at least one control signal and provides the bias voltage for the MOSFET. The charge pump may receive a reference voltage and provide the bias voltage at a gate of the MOSFET. The MOSFET may comprise an nMOSFET. In this case, the bias voltage may be higher than a source voltage of the MOSFET by an amount determined by the reference voltage.

In an exemplary design, the gate drive circuit may include a capacitor (e.g., capacitor 830 in FIG. 8) that is charged by the reference voltage and provides the bias voltage to the MOSFET. The at least one control signal may include a first control signal (e.g., the C1 signal in FIG. 8) and a second control signal (e.g., the C2 signal). The gate drive circuit may further include first and second switches. The first switch (e.g., switch 810) may be coupled between the reference voltage and the capacitor and may be controlled by the first control signal. The second switch (e.g., switch 850) may be coupled between the capacitor and the MOSFET and may be controlled by the second control signal. The gate drive circuit may include additional switches (e.g., switch 820) and/or other circuits (e.g., diode 840).

The gate drive circuit may have (i) a first drive capability for a first sensed temperature (e.g., 25° C.) and (ii) a second drive capability that is greater than the first drive capability for a second sensed temperature (e.g., 100° C.) that is higher than the first sensed temperature. The gate drive circuit may generate the bias voltage based on (i) the control signal(s) at a first frequency for the first sensed temperature and (ii) the control signal(s) at a second frequency that is higher than the first frequency for the second sensed temperature. The MOSFET may have (i) a first gate leakage current at the first sensed temperature and (ii) a second gate leakage current that is higher than the first gate leakage current at the second sensed temperature. The gate drive circuit may provide (i) a first bias current at the first sensed temperature and (ii) a second bias current that is higher than the first bias current, to account for the higher second gate leakage current, at the second sensed temperature.

In an exemplary design, the control circuit and the gate drive circuit may generate the bias voltage to maintain an ON resistance of the MOSFET within a target range of resistance over a predetermined range of temperature. This may be achieved by adjusting the drive capability of the gate drive circuit to account for gate leakage current of the MOSFET that varies across temperature, as described above.

Figure 9:
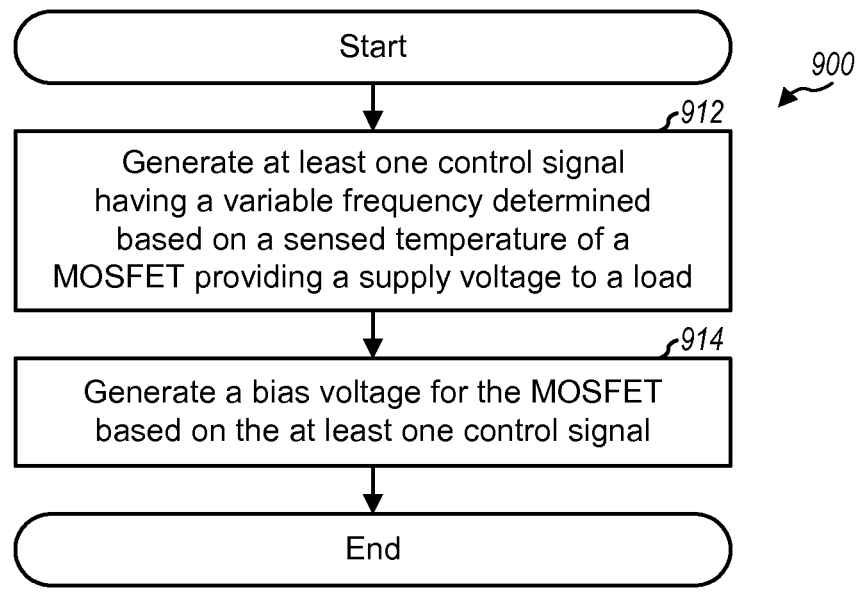
FIG. 9 shows a process for generating a gate bias voltage for a MOSFET.

FIG. 9 shows an exemplary design of a process 900 for generating a bias voltage for a MOSFET. At least one control signal having a variable frequency may be determined based on a sensed temperature of a MOSFET, which provides a supply voltage to a load (block 912). A bias voltage for the MOSFET may be generated based on the at least one control signal (block 914).

In one design of block 912, a clock divider ratio may be determined based on an input signal indicative of the sensed temperature of the MOSFET. For example, the input signal may be quantized to obtain a digital value, and the clock divider ratio may be determined based on the digital value and a look-up table. An input clock signal may be divided based on the clock divider ratio to obtain a variable clock signal having the variable frequency. The at least one control signal may be generated based on the variable clock signal.

In one design of block 914, the bias voltage may be generated based on the at least one control signal and a charge pump. The bias voltage may be generated based on (i) a first drive capability for a first sensed temperature and (ii) a second drive capability that is greater than the first drive capability for a second sensed temperature that is higher than the first sensed temperature.

The adaptive gate drive circuit described herein may be implemented on an IC, an analog IC, an RFIC, a mixed-signal IC, an ASIC, a printed circuit board (PCB), an electronic device, etc. The adaptive gate drive circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the adaptive gate drive circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:
1. An apparatus comprising:
a control circuit configured to generate at least one control signal having a variable frequency determined based on a sensed temperature of a metal oxide semiconductor field effect transistor (MOSFET) coupled between a supply voltage and a load;
a gate drive circuit configured to generate a bias voltage for the MOSFET based on the at least one control signal; and
a control signal generator configured to receive a variable clock signal having the variable frequency and generate the at least one control signal based on the variable clock signal, 3, the control circuit further comprising:
a temperature compensation circuit configured to receive an input signal indicative of the sensed temperature of the MOSFET and to determine a clock divider ratio based on the input signal; and
a clock divider configured to divide an input clock signal based on the clock divider ratio to obtain the variable clock signal.

2. The apparatus of claim 1, the temperature compensation circuit comprising:
a quantizer configured to quantize the input signal and provide a digital value; and
a look-up table configured to receive the digital value and provide the clock divider ratio.

3. The apparatus of claim 1, the temperature compensation circuit comprising:
at least one comparator configured to compare the input signal against at least one threshold and provide at least one output signal; and
a look-up table configured to receive the at least one output signal and provide the clock divider ratio.

4. An apparatus comprising:
a control circuit configured to generate at least one control signal having a variable frequency determined based on a sensed temperature of a metal oxide semiconductor field effect transistor (MOSFET) coupled between a supply voltage and a load;
a gate drive circuit configured to generate a bias voltage for the MOSFET based on the at least one control signal; and
a control signal generator configured to receive a variable clock signal having the variable frequency and generate the at least one control signal based on the variable clock signal, the control circuit comprising:
an oscillator configured to receive an input signal indicative of the sensed temperature of the MOSFET and to provide the variable clock signal.

5. An apparatus comprising:
a control circuit configured to generate at least one control signal having a variable frequency determined based on a sensed temperature of a metal oxide semiconductor field effect transistor (MOSFET) coupled between a supply voltage and a load; and
a gate drive circuit configured to generate a bias voltage for the MOSFET based on the at least one control signal, the gate drive circuit comprising:
a charge pump configured to receive the at least one control signal and provide the bias voltage for the MOSFET.

6. The apparatus of claim 5, the charge pump configured to receive a reference voltage and provide the bias voltage at a gate of the MOSFET, the bias voltage being higher than a source voltage of the MOSFET by an amount determined by the reference voltage.

7. An apparatus comprising:
a control circuit configured to generate at least one control signal having a variable frequency determined based on a sensed temperature of a metal oxide semiconductor field effect transistor (MOSFET) coupled between a supply voltage and a load; and
a gate drive circuit configured to generate a bias voltage for the MOSFET based on the at least one control signal, the gate drive circuit comprising:
a capacitor configured to be charged by a reference voltage and to provide the bias voltage to the MOSFET.

8. The apparatus of claim 7, the at least one control signal comprising a first control signal and a second control signal, and the gate drive circuit further comprising:
a first switch coupled between the reference voltage and the capacitor and controlled by the first control signal, and
a second switch coupled between the capacitor and the MOSFET and controlled by the second control signal.

9. An apparatus comprising:
a control circuit configured to generate at least one control signal having a variable frequency determined based on a sensed temperature of a metal oxide semiconductor field effect transistor (MOSFET) coupled between a supply voltage and a load;
a gate drive circuit configured to generate a bias voltage for the MOSFET based on the at least one control signal, the gate drive circuit generating the bias voltage based on the at least one control signal at a first frequency for a first sensed temperature and generating the bias voltage based on the at least one control signal at a second frequency higher than the first frequency for a second sensed temperature higher than the first sensed temperature.

10. A method comprising:
generating at least one control signal having a variable frequency determined based on a sensed temperature of a metal oxide semiconductor field effect transistor (MOSFET) providing a supply voltage to a load; and
generating a bias voltage for the MOSFET based on the at least one control signal, the generating at least one control signal comprising generating the at least one control signal based on a variable clock signal having the variable frequency, the generating at least one control signal further comprising:
determining a clock divider ratio based on an input signal indicative of the sensed temperature of the MOSFET; and
dividing an input clock signal based on the clock divider ratio to obtain the variable clock signal.

11. The method of claim 10, the determining a clock divider ratio comprising:
quantizing the input signal to obtain a digital value; and
determining the clock divider ratio based on the digital value and a look-up table.

12. A method comprising:
generating at least one control signal having a variable frequency determined based on a sensed temperature of a metal oxide semiconductor field effect transistor (MOSFET) providing a supply voltage to a load; and
generating a bias voltage for the MOSFET based on the at least one control signal, the generating a bias voltage comprising generating the bias voltage based on the at least one control signal and a charge pump.

13. An apparatus comprising:
means for generating at least one control signal having a variable frequency determined based on a sensed temperature of a means for supplying a supply voltage to a load; and
means for generating a bias voltage for the means for supplying based on the at least one control signal, the means for generating at least one control signal comprising means for generating the at least one control signal based on a variable clock signal having the variable frequency, the means for generating at least one control signal further comprising:
means for determining a clock divider ratio based on an input signal indicative of the sensed temperature of the means for supplying; and
means for dividing an input clock signal based on the clock divider ratio to obtain the variable clock signal.

14. The apparatus of claim 13, the means for determining a clock divider ratio comprising:
means for quantizing the input signal to obtain a digital value; and
means for determining the clock divider ratio based on the digital value.

15. An apparatus comprising:
means for generating at least one control signal having a variable frequency determined based on a sensed temperature of a means for supplying a supply voltage to a load; and
means for generating a bias voltage for the means for supplying based on the at least one control signal, the means for generating a bias voltage comprising means for generating the bias voltage based on the at least one control signal and a charge pump.

* * * * *